United States Patent
Ohtsuka

(10) Patent No.: US 7,238,952 B2
(45) Date of Patent: Jul. 3, 2007

(54) METAL ION EMISSION DEVICE AND PROCESS FOR PRODUCING THE SAME, ION BEAM IRRADIATION DEVICE, PROCESSING APPARATUS AND ANALYZING APPARATUS PROVIDED WITH EMISSION DEVICE

(75) Inventor: Mitsuru Ohtsuka, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 10/543,812

(22) PCT Filed: Nov. 16, 2004

(86) PCT No.: PCT/JP2004/017330

§ 371 (c)(1),
(2), (4) Date: Aug. 1, 2005

(87) PCT Pub. No.: WO2005/050694

PCT Pub. Date: Jun. 2, 2005

(65) Prior Publication Data

US 2006/0145090 A1    Jul. 6, 2006

(30) Foreign Application Priority Data

Nov. 20, 2003  (JP) .............................. 2003-390247

(51) Int. Cl.
*H01J 27/00*   (2006.01)

(52) U.S. Cl. ............... 250/425; 250/423 R; 250/423 F; 250/423 A; 250/309; 313/362.1; 313/230; 313/232; 445/46; 445/59

(58) Field of Classification Search ..................... None
See application file for complete search history.

(56) References Cited

U.S. PATENT DOCUMENTS

| | | | |
|---|---|---|---|
| 4,892,752 A * | 1/1990 | Fukuda ....................... 427/527 |
| 5,399,865 A | 3/1995 | Umemura et al. ....... 250/423 F |
| 6,531,811 B1 * | 3/2003 | Kudo et al. .............. 313/362.1 |
| 6,768,119 B2 * | 7/2004 | de la Mora et al. ..... 250/423 R |

OTHER PUBLICATIONS

A. Thess, et al., "Crystalline Ropes of Metallic Carbon Nanotubes", Science, vol. 273, pp. 483-487 (Jul. 26, 1996).
Y. Gao, et al., "Carbon Nanothermometer Containing Gallium", Nature, vol. 415, p. 599 (Feb. 7, 2002).
Kinzoku, Materials Science & Technology, vol. 72, No. 9, pp. 859-863 (2002) (and English translation).

* cited by examiner

*Primary Examiner*—Jack I. Berman
*Assistant Examiner*—Zia R. Hashmi
(74) *Attorney, Agent, or Firm*—Fitzpatrick, Cella, Harper & Scinto

(57) ABSTRACT

A metal ion emission device for emitting a metal ion by applying voltage to a molten liquid metal includes a needle-like part having an internal opening in which the liquid metal can be moved. The needle-like part has a first opening for supplying the liquid metal to the opening and a second opening for emitting the liquid metal as a metal ion.

9 Claims, 2 Drawing Sheets

METAL ION EMISSION DEVICE AND PROCESS FOR PRODUCING THE SAME, ION BEAM IRRADIATION DEVICE, PROCESSING APPARATUS AND ANALYZING APPARATUS PROVIDED WITH EMISSION DEVICE

TECHNICAL FIELD

The present invention relates to a metal ion emission device for emitting a metal ion from a liquid metal, an ion beam irradiation device provided with the metal ion emission device, a processing apparatus and an analyzing apparatus provided with the ion beam irradiation device, and a process for producing the metal ion emission device. More particularly, the present invention relates to the metal ion emission device used for processing or film-forming in a minute region, mass analysis of a minute region or the like, and a process for producing the device.

BACKGROUND ART

When a liquid metal ion source (abbreviated to LMIS), in which a metal ion is emitted by applying an intense electric field to a molten liquid metal, is used, the ion can be emitted from a minute area, and a minute probe can be focused on a sample while maintaining a high current density. In recent years, LMIS thus characterized by high luminance and minuteness of a probe has become applied for use in the manufacturing industry and in the field of analysis techniques.

The focused ion beam (FIB) is a microfabrication technology provided with LMIS as an ion source. Devices using Ga or In, which is as a low-melting metal, as a material for LMIS have become commercially available, and are widely used as a maskless microfabrication means. FIB is also effective as means for preparing a sample for a transmission electron microscope or the like, and allows the precise and efficient thinning of a specific portion of interest. Further, FIB is very effective as means for observing and analyzing the surface of a sample at a high spatial resolution by detecting a secondary ion generated from the sample by ion irradiation. TOF-SIMS (Time of flight-secondary mass spectrometry) is one of such analysis methods, and can analyze components of the surface of a sample at a spatial resolution in the order of submicrons by measuring the mass of a secondary ion emitted from the sample by FIB irradiation.

As described in U.S. Pat. No. 5,399,865 in detail, for example, LMIS is configured as a hairpin-type or reservoir-type LMIS. As a modification of the reservoir-type LMIS, a capillary needle-type LMIS or the like is known. Further, the same U.S. Patent discloses improved versions of these types.

In the hairpin-type LMIS, a needle-like metal is spot-welded to a curved portion in the center of a hairpin-like metal wire, and the molten metal is stored on the surface of the needle-like metal from near the curved portion by surface tension. The reservoir-type LMIS, in which a reservoir for retaining a liquid metal is placed near an emitter, has a configuration that can store a liquid metal in an amount larger than that of the hairpin-type LMIS. The capillary needle-type LMIS, in which a capillary is formed at the lower end of a reservoir, allows a molten ion material to be easily supplied to an apex of an emitter by utilizing the capillary action between the capillary and the emitter penetrating the capillary. An improved type of LMIS disclosed in U.S. Pat. No. 5,399,865 is characterized in that an emitter portion can be heated by electron bombardment using thermoelectrons from a reservoir heated by current conduction with no molten ion material charged. The emitter is cleaned by this heating using electron bombardment, which can allow a molten ion material to flow in a stable manner.

In order to generate a stable ion beam from LMIS, it is important to supply a molten ion material to the apex of an emitter of LMIS in a stable manner. In all conventional LMISs described above, a molten ion material surely passes through the surface of an emitter when the material is supplied to the apex of the emitter. Therefore, in order to maintain the flow of a molten liquid in a stable manner, the surface of the emitter must be clean and smooth.

In order to generate a stable ion beam from LMIS, at least the apex of an emitter must be maintained in an ultrahigh vacuum atmosphere for avoiding influence by the remaining gas molecules. On the other hand, it is generally known from the viewpoint of the kinetic theory of gas molecules that the gas molecular flux of $p/\sqrt{2\pi mkT}$ with respect to the partial pressure p is incident on the surface of an emitter. Here, the reference character m denotes a molecular weight of gas molecules of interest, the reference character k denotes Boltzmann constant, and the reference character T denotes a temperature. Therefore, even in a device operated in an ultrahigh vacuum environment at $1\times10^{-10}$ Torr, when emission has been suspended for a prescribed time or longer, operations such as flushing and aging are imperative for restoring the clean surface of an emitter.

In order to form a minute probe by LMIS, the ion emission area at the apex of an emitter is desirably as small as possible. However, the ion emission area depends on the curvature of a molten ion material covering the apex of the emitter. Therefore, it is difficult to achieve a very minute ion emission area.

DISCLOSURE OF THE INVENTION

An object of the present invention is to solve the above problems and to provide a metal ion emission device that can have a very minute area for emitting a metal ion and has a structure in which a flow of a liquid metal to an ion emission part is not easily influenced by the vacuum environment or the like, an ion beam irradiation device provided with the metal ion emission device, a processing apparatus and an analyzing apparatus provided with the ion beam irradiation device, and a process for producing the metal ion emission device.

According to an aspect of the present invention, there is provided a metal ion emission device for emitting a metal ion by applying voltage to a molten liquid metal, which comprises a needle-like part having a hole in which a liquid metal can be moved, and the needle-like part has a first opening for supplying the liquid metal to the hole and a second opening for emitting the liquid metal as a metal ion. The needle-like part is preferably a carbon nanotube.

According to another aspect of the present invention, there is provided an ion beam irradiation device comprising the metal ion emission device.

According to still another aspect of the present invention, there is provided a processing apparatus comprising the ion beam irradiation device.

According to a further aspect of the present invention, there is provided an analyzing apparatus comprising the ion beam irradiation device.

According to a further aspect of the present invention, there is provided a process for producing the metal ion emission device for emitting a metal ion from a metal ion emission part formed at an apex of a reservoir by applying voltage to a molten liquid metal, which comprises the steps of:

selecting a needle-like member having a hole with a shape suitable for the metal ion emission part from products produced in a vacuum vessel by arc discharge, and transporting the selected needle-like member to a flat region formed at the apex of the reservoir, and depositing hydrocarbon in the flat region to secure the needle-like member. The step for selecting the needle-like member is preferably a step for selecting a carbon nanotube from the products.

According to the present invention, a metal ion emission device that can have a very minute area for emitting a metal ion and has a structure in which the flow of a liquid metal to the ion emission part is not easily influenced by the vacuum environment or the like, an ion beam irradiation device provided with the metal ion emission device, a processing apparatus and an analyzing apparatus provided with the ion beam irradiation device, and a process for producing the metal ion emission device can be provided.

BEST MODE FOR CARRYING OUT THE INVENTION

A carbon nanotube has a structure in which a cylindrical hollow region with a diameter in the order of nanometers is covered with a graphite layer. A carbon nanotube with a single graphite layer is called SWCNT (Single walled carbon nanotube), and a carbon nanotube with a plurality of graphite layers is called MWCNT (Multi-walled carbon nanotube) (see Science, 273, 483 (1996), for example). As a method for preparing a carbon nanotube, arc discharge using graphite, CVD, and the like are known (see Kinzoku, vol. 72, No. 9 (2002) p. 859, for example).

A carbon nanotube has a structure in which the apex is closed by a graphite sheet or opened. The fact that a liquid can be introduced into a carbon nanotube with an open apex by the effect of its surface tension has been theoretically proved, and has been experimentally reported in Nature 415, 599, 2002. Further, the above document has reported that, when Ga as a low-melting metal is introduced into a carbon nanotube, the surface of liquid Ga in the nanotube is moved by thermal expansion, and the nanotube can be used as a minute thermometer utilizing this feature.

As a result of extensive studies to realize the metal ion emission device of the present invention which has an ideal form having a minute emission area as LMIS, the present inventors have focused attention on the fact shown in the above document that a liquid can be introduced into and moved smoothly in a carbon nanotube. Thus, a liquid metal ion source, in which an emitter is composed of a needle-like substance having holes formed by self-assembly, the metal liquid is supplied from one opening of the needle-like substance, transported through the holes, and emitted from the other opening as a metal ion, and the metal ion is emitted by applying the extraction voltage to the molten metal, has been realized. As the needle-like substance having holes formed by self-assembly, a carbon nanotube can be used, for example. In this case, the area for emitting a liquid metal is determined according to the internal diameter of the nanotube at the open end. Accordingly, when a carbon nanotube is used, an emission end with a minute size for emission in the order of nanometers can be easily realized. Further, the inside of the nanotube is separated from the outside by the wall of the nanotube, and thus is influenced by the external environment only with difficulty. In addition, the nanotube formed by self-assembly is a smooth and ideal one-dimensional channel, and has an ideal inner wall structure that can form a stable and steady flow of a liquid metal.

EXAMPLE

The present invention will now be described with reference to the example. However, the present invention should not be limited to this example.

Figure 1:
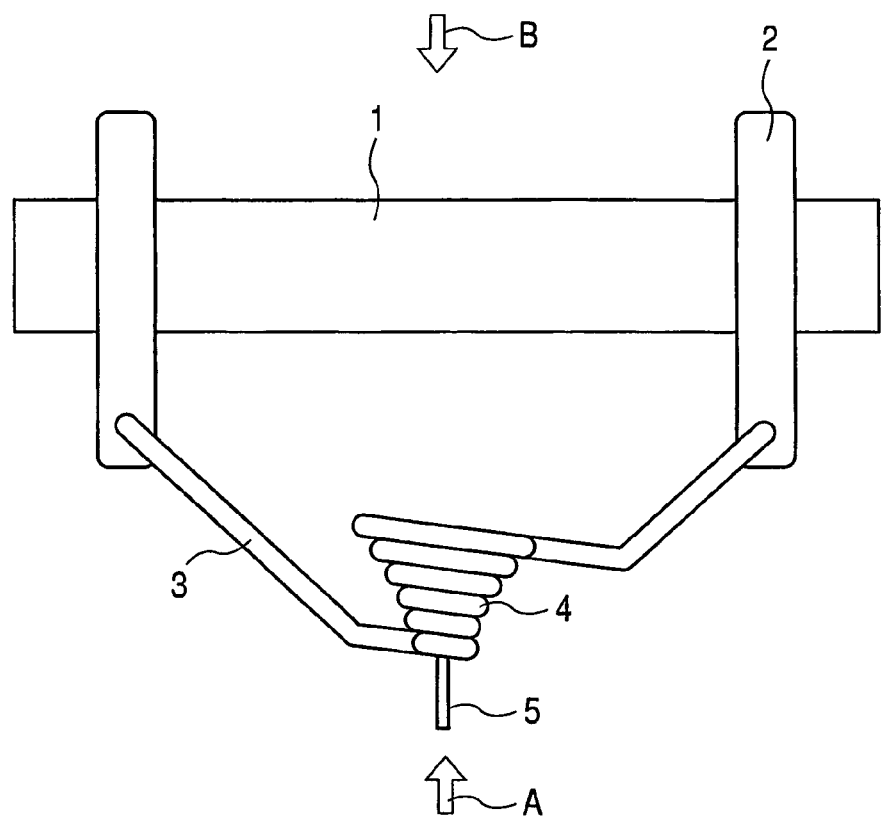
FIG. 1 is a view showing a metal ion emission device in an example of the present invention.
Figure 2:
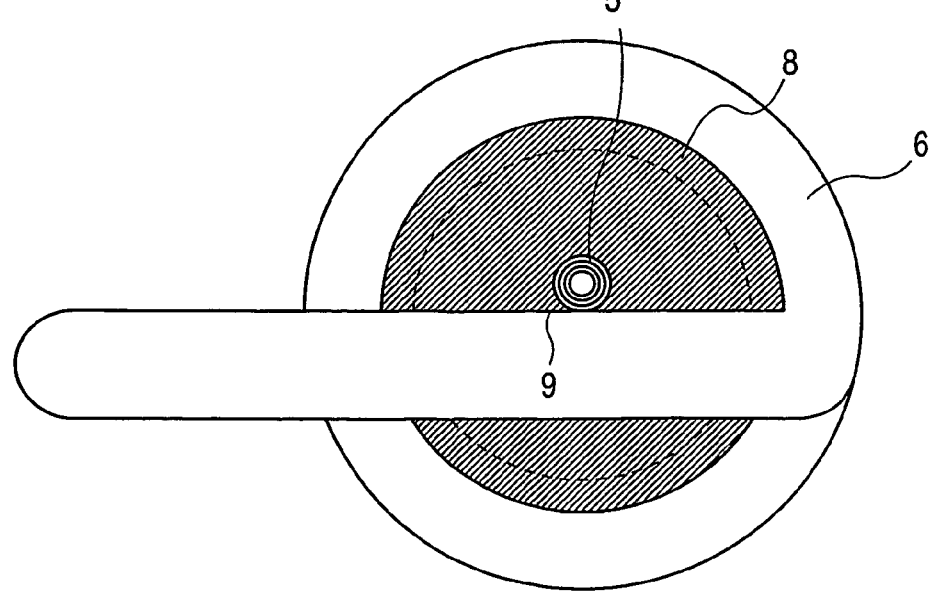
FIG. 2 is an enlarged schematic view showing an apex of a reservoir in the metal ion emission device in an example of the present invention viewed in the direction of the arrow A in FIG. 1.

FIG. 1 shows a structure of a metal ion emission device in this example. FIG. 2 shows an enlarged schematic view of an apex of a reservoir in this device viewed in the direction of the arrow A in FIG. 1. In FIG. 1, the reference numeral 1 denotes an insulator, the reference numeral 2 denotes column electrodes penetrated into and secured to the insulator 1, the reference numeral 3 denotes a tungsten wire spot-welded to the column electrodes 2, the reference numeral 4 denotes the reservoir obtained by forming the tungsten wire 3 into a spiral, and the reference numeral 5 denotes a multi-walled carbon nanotube (MWCNT) with both ends opened. In FIG. 2, the reference numeral 6 denotes the apex of the reservoir, and the reference numeral 8 denotes hydrocarbon for joining the carbon nanotube to the reservoir.

First, one example of a method for preparing the carbon nanotube and a method for securing the carbon nanotube to the apex of the reservoir will be described below with reference to the drawings.

An apparatus in which FIB and a scanning electron microscope form a complex (hereinafter referred to as FIB-SEM), provided with a manipulator equipped with a carbon nanotube probe (hereinafter referred to as "nanoprobe") for manipulating a minute test specimen, is prepared.

The tungsten wire 3 forming the reservoir 4 is carried in FIB-SEM and secured to the column electrodes 2. A flat region 9 for securing the carbon nanotube 5 to the side of the tungsten wire at the reservoir apex 6 is formed by FIB processing.

Arc discharge is conducted using carbon rods opposed to each other in a vacuum vessel as electrodes to collect products on the negative electrode. The carbon nanotube 5 having a shape suitable for the emitter is selected from the collected products by SEM observation, and is transported to the flat region 9 using the nanoprobe.

Next, a certain region is scanned using electron beams of SEM while injecting a methane gas into near the reservoir apex, and the hydrocarbon 8 is deposited on the scanned region to secure the carbon nanotube 5 to the reservoir apex.

After terminating injection of a methane gas and discharging air sufficiently, a current is caused to flow through the column electrodes 2 to heat the reservoir by current conduction, whereby the vicinity of the reservoir is cleaned.

Figure 3:
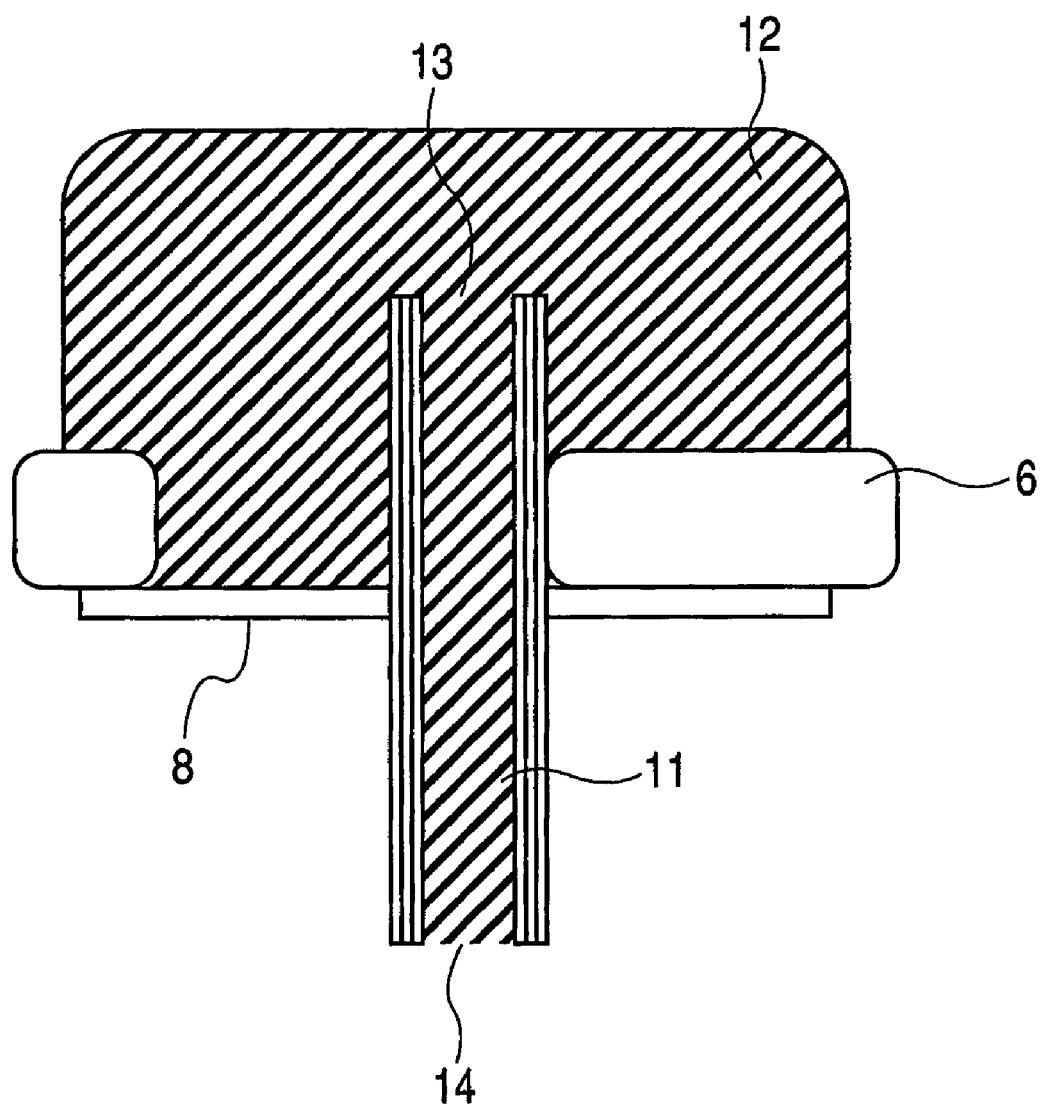
FIG. 3 is a view schematically showing a cross-section of an emitter charged with Ga in an example of the present invention.

Ga can be easily charged by dropping melted Ga droplets in the direction of the arrow B in FIG. 1. In a step of solidification of the charged Ga by being allowed to be cool, a discoid metal plate (not shown in the figures) was held to the surface of the Ga and the circumference of the plate was soldered with the inner wall of reservoir 4 to confine the Ga in the reservoir 4. FIG. 3 schematically shows a part of the cross-section of the emitter charged with Ga. A current is applied to the reservoir through column electrodes 2 to melt the Ga and raise the temperature appropriately, whereby the Ga is thermally expanded to make the Ga penetrate into the inside of carbon nanotube 11. Although the position of the Ga surface in the carbon nanotube depends on the length and internal diameter of the carbon nanotube, the temperature of liquid Ga and the like, the surface reaches near the apex under certain conditions. As is clear from FIG. 3, the liquid Ga is supplied from the inside 12 of the liquid region to one end 13 of the carbon nanotube, and reaches the apex 14 via the inside 11 of the carbon nanotube. In this process, Ga does not come close to a metal surface other than the inner wall of the carbon nanotube or the interface between the carbon nanotube and the vacuum.

When LMIS comprising a carbon nanotube formed in the above process is attached to a FIB device, and an electric field is applied to liquid Ga, ionized Ga is emitted from the apex 14 of the carbon nanotube. According to this example, since the ion emission region of the apex 14 as an ion emission part can have a prescribed minute area by selecting the size of the carbon nanotube, a probe excellent in focusing properties can be formed. In addition, since the inner wall of the carbon nanotube forms an ideal channel for forming a steady Ga flow, stable ion emission properties can be obtained.

This application claims priority from Japanese Patent Application No. 2003-390247 filed Nov. 20, 2003, which is hereby incorporated by reference herein.

The invention claimed is:

1. A metal ion emission device for emitting a metal ion by applying voltage to a molten liquid metal, comprising:
   a needle-like part having an internal opening in which a liquid metal can be moved, and the needle-like part is a carbon nanotube and has a first opening for supplying the liquid metal to the internal opening and a second opening for emitting the liquid metal as a metal ion.

2. An ion beam irradiation device comprising the metal ion emission device according to claim 1.

3. A processing apparatus comprising the ion beam irradiation device according to claim 2.

4. An analyzing apparatus comprising the ion beam irradiation device according to claim 2.

5. An ion beam irradiation device comprising the metal ion emission device according to claim 1.

6. A processing apparatus comprising the ion beam irradiation device according to claim 5.

7. An analyzing apparatus comprising the ion beam irradiation device according to claim 5.

8. A process for producing a metal ion emission device for emitting a metal ion from a metal ion emission part formed at an apex of a reservoir by applying voltage to a molten liquid metal, comprising the steps of:
   selecting a carbon nanotube needle-like member having an internal opening and openings at both ends of the internal opening from products produced in a vacuum vessel by arc discharge, and
   transporting the selected carbon nanotube to a flat region formed at the apex of the reservoir, and depositing hydrocarbons in the flat region to secure the carbon nanotube.

9. A metal ion device according to claim 1, further comprising:
   an insulator;
   column electrodes secured to the insulator; and
   a reservoir, secured to the column electrodes, to supply the liquid metal to the carbon nanotube.

* * * * *

UNITED STATES PATENT AND TRADEMARK OFFICE
CERTIFICATE OF CORRECTION

| | | |
|---|---|---|
| PATENT NO. | : 7,238,952 B2 | Page 1 of 1 |
| APPLICATION NO. | : 10/543812 | |
| DATED | : July 3, 2007 | |
| INVENTOR(S) | : Mitsuru Ohtsuka | |

It is certified that error appears in the above-identified patent and that said Letters Patent is hereby corrected as shown below:

COLUMN 5:

Line 12, "cuffent" should read --current--.

Signed and Sealed this

Third Day of February, 2009

JOHN DOLL
*Acting Director of the United States Patent and Trademark Office*